(12) United States Patent
Gaddi et al.

(10) Patent No.: US 12,112,909 B2
(45) Date of Patent: Oct. 8, 2024

(54) MEMS RELAY ARCHITECTURE WITH FREQUENCY ISOLATION

(71) Applicant: Qorvo US, Inc., Greensboro, NC (US)

(72) Inventors: Roberto Gaddi, Rosmalen (NL); Robertus Petrus Van Kampen, S-Hertogenbosch (NL)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/344,186

(22) Filed: Jun. 29, 2023

(65) Prior Publication Data

US 2023/0395348 A1 Dec. 7, 2023

Related U.S. Application Data

(63) Continuation of application No. 16/907,161, filed on Jun. 19, 2020, now Pat. No. 11,728,116.

(60) Provisional application No. 62/865,202, filed on Jun. 22, 2019.

(51) Int. Cl.
  *H01H 59/00* (2006.01)
  *H01P 1/12* (2006.01)
(52) U.S. Cl.
  CPC .......... *H01H 59/0009* (2013.01); *H01P 1/12* (2013.01)
(58) Field of Classification Search
  CPC .... H01H 59/0009; H01H 1/0036; H01P 1/12; B81B 3/0086–7/008
  See application file for complete search history.

(56) References Cited

U.S. PATENT DOCUMENTS

| | | | |
|---|---|---|---|
| 8,861,218 B2 | 10/2014 | Smith et al. | |
| 9,281,128 B2 | 3/2016 | Morris et al. | |
| 11,728,116 B2 | 8/2023 | Gaddi et al. | |
| 2004/0091203 A1 | 5/2004 | Huber et al. | |

OTHER PUBLICATIONS

Non-Final Office Action for U.S. Appl. No. 16/907,161, mailed Mar. 7, 2022, 7 pages.
Final Office Action for U.S. Appl. No. 16/907,161, mailed Jul. 13, 2022, 6 pages.
Non-Final Office Action for U.S. Appl. No. 16/907,161, mailed Dec. 21, 2022, 8 pages.
Notice of Allowance for U.S. Appl. No. 16/907,161, mailed Mar. 29, 2023, 8 pages.
Supplemental Notice of Allowability for U.S. Appl. No. 16/907,161, mailed Apr. 13, 2023, 4 pages.

*Primary Examiner* — Vanessa Girardi
(74) *Attorney, Agent, or Firm* — Withrow & Terranova, P.L.L.C.

(57) ABSTRACT

An electrical arrangement for performing radio frequency isolation for microelectromechanical relay switches. A microelectromechanical relay switch comprises a beam configured to switch from a first position connected to an upper voltage source to a second position connected to a lower voltage source. The microelectromechanical relay switch further comprises at least one frequency isolation circuit or resistor disposed adjacent to the beam. The at least one frequency isolation circuit or resistor biases a direct current potential to allow for electrostatic actuation and further provides a path for transient electrical currents during switching.

16 Claims, 8 Drawing Sheets

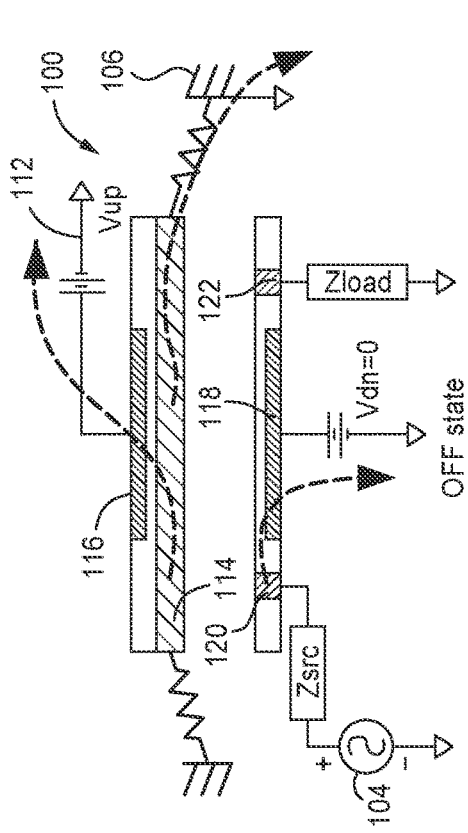
FIG. 1A
(PRIOR ART)
FIG. 1B
(PRIOR ART)
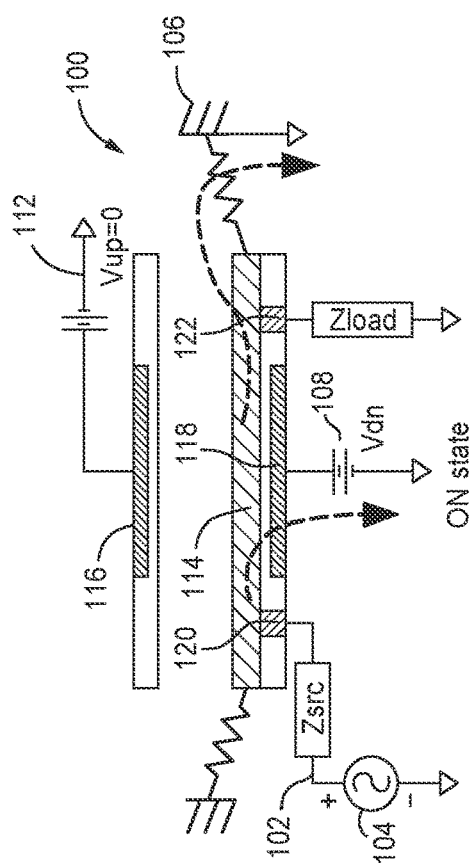
FIG. 1C
(PRIOR ART)
FIG. 1D
(PRIOR ART)

ON state

OFF state

ON state

OFF state

MEMS RELAY ARCHITECTURE WITH FREQUENCY ISOLATION

RELATED APPLICATIONS

This application is a continuation of U.S. patent application Ser. No. 16/907,161, filed Jun. 19, 2020, now U.S. Pat. No. 11,728,116, which claims the benefit of U.S. provisional patent application No. 62/865,202, filed Jun. 22, 2019, the disclosure of which is incorporated herein by reference in its entirety.

FIELD OF THE DISCLOSURE

Embodiments of the disclosure generally relate to microelectromechanical (MEMS) relay switches. More specifically, aspects of the disclosure relate to methods and apparatus to operate electrostatically actuated MEMS relay switches within radio-frequency circuits and systems.

BACKGROUND

With the advent of microelectronics, manufacturers are challenged to provide solutions to electrical problems that electronics users encounter. In some industries, such as wireless phone technologies, there is a need to provide accurate tuning to frequencies while minimizing costs of the overall electrical arrangements and circuits to achieve these functions. MEMS relay switches are often utilized in such electrical circuits, as MEMS relay switches provide advantages that conventional electrical arrangements cannot provide.

However, MEMS relays which are operated using electrostatic actuation and used in radio-frequency electrical circuits can be affected by radio frequency (RF) power leakage, which negatively affects the overall performance of the circuit and system. FIGS. 1A-1D illustrate an exemplary electrostatic actuated MEMS relay 100 for a direct current switching application experiencing RF power leakage. The MEMS relay 100 has both a "down" and "up" electrostatic actuation capability. In FIG. 1A, an "on" state for the MEMS relay 100 is illustrated. A power source 104 is connected through a power source circuit 102 to the MEMS relay 100. A beam 114 disposed above the power source circuit 102 is connected to ground 106. The MEMS relay 100 further comprises a lower voltage source (Vdn) 108 coupled to a first electrode 118, a first RF electrode 120, a second RF electrode 122, a pull up electrode 116, and an upper voltage source (Vup) 112 coupled to a pull up electrode 116. The load impedance of the MEMS relay 100 is represented by Zload and the source impedance is represented by Zsrc. During the "on" state, electrical losses for RF occur down Vdn 108 as well as through the ground connection 106. Such RF losses may be substantial and lead to overall operability degradation.

FIG. 1B illustrates the MEMS relay 100 of FIG. 1A in an "off" state, where RF losses occur not only through the previously provided Vdn path 108 and through the ground connection 106, but also through the pull up electrode 116 and Vup connection 112. Thus, in both "on" and "off" states, significant RF losses can occur. For this reason, these types of circuits may be sparingly used in electrical circuits.

FIG. 1C illustrates a schematic of a MEMS relay 100 having only a "down" electrostatic actuation. As such, the portion of the Vup connection 112 and the pull up electrode 116, as provided in FIGS. 1A-1B, are removed. In the "on" state described in FIG. 1C, RF loss paths exist both down the Vdn path 108 and through the ground connection 106, similar to that described above in relation to FIG. 1A. FIG. 1D illustrates the MEMS relay 100 of FIG. 1C in the "off" state, where RF losses occur through the ground connection 106 as well as through the Vdn path 108.

Therefore, there is a need to prevent and/or minimize RF loss in MEMS relays and electrical circuits while providing a cost effective and compact arrangement.

SUMMARY

An electrical arrangement is disclosed for performing radio frequency isolation for microelectromechanical relay switches. A microelectromechanical relay switch comprises a beam configured to switch from a first position connected to an upper voltage source to a second position connected to a lower voltage source. The microelectromechanical relay switch further comprises at least one frequency isolation circuit or resistor disposed adjacent to the beam. The at least one frequency isolation circuit or resistor biases a direct current potential to allow for electrostatic actuation and further provides a path for transient electrical currents during switching.

In one embodiment, an electrical arrangement comprises a first microelectromechanical relay, the first microelectromechanical relay comprising a beam configured to switch from a first position adjacent to a first electrode to a second position adjacent a second electrode, a first resistor disposed between the beam and a first electrode, and a second resistor connected between the beam and the second electrode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

FIGS. 1A-1D are prior art schematic figures of an electrostatic actuated MEMS relay experiencing RF power leakage.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 2A:
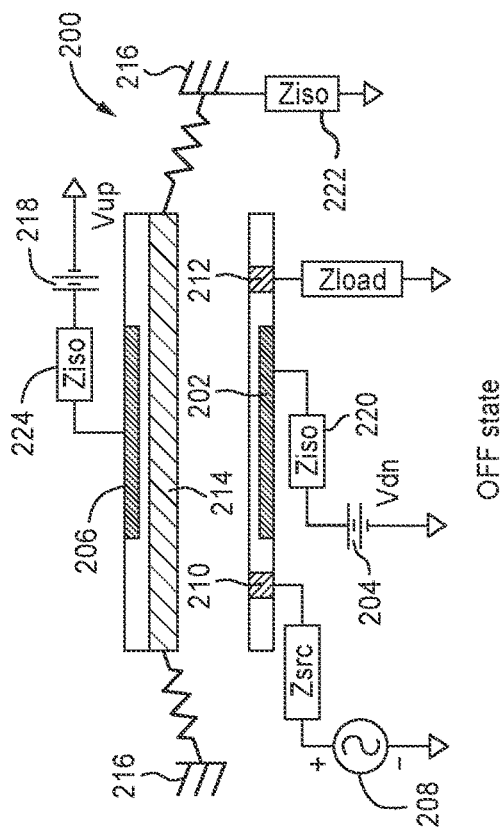
FIGS. 2A-2D are schematic figures of a direct current network using a MEMS relay with RF isolation.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

An electrical arrangement is disclosed for performing radio frequency isolation for microelectromechanical relay switches. A microelectromechanical relay switch comprises a beam configured to switch from a first position connected to an upper voltage source to a second position connected to a lower voltage source. The microelectromechanical relay switch further comprises at least one frequency isolation circuit or resistor disposed adjacent to the beam. The at least one frequency isolation circuit or resistor biases a direct current potential to allow for electrostatic actuation and further provides a path for transient electrical currents during switching.

Some embodiments will now be described with reference to the figures. Like elements in the various figures may be referenced with like numbers for consistency. In the following description, numerous details are set forth to provide an understanding of various embodiments and/or features. It will be understood, however, by those skilled in the art that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point or element are used in this description to more clearly describe certain embodiments, and are not intended to be limiting.

Embodiments of circuits illustrated provide for RF isolation in cases where such frequency isolation is necessary. This RF isolation is intended for electrical components based upon silicon and other similarly compatible based arrangement as compared to conventional resistor and wiring circuitry. Embodiments illustrated may be used, for example in non-limiting embodiments, in wireless communication devices, such as cell phones. As the need for accurate tuning to a specific frequency is needed, arrangements illustrated herein are particularly advantageous compared to conventional apparatuses, as RF loss paths are eliminated. Such MEMS based components may also be easily manufactured, enhancing their overall value to electrical component manufacturers. Although described as being related to wireless communication devices, other uses may also be covered where signal isolation and prevention of cross-talk is needed. Such embodiments may be related to automotive, flight, aerospace, wireless, telemetry and other fields of discipline. Moreover, as electrical components shrink in size and cross talk becomes a significant issue, such method and apparatus shown alleviate concerns, and therefore, the electrical aspects described above should not be considered limiting.

Figure 2B:
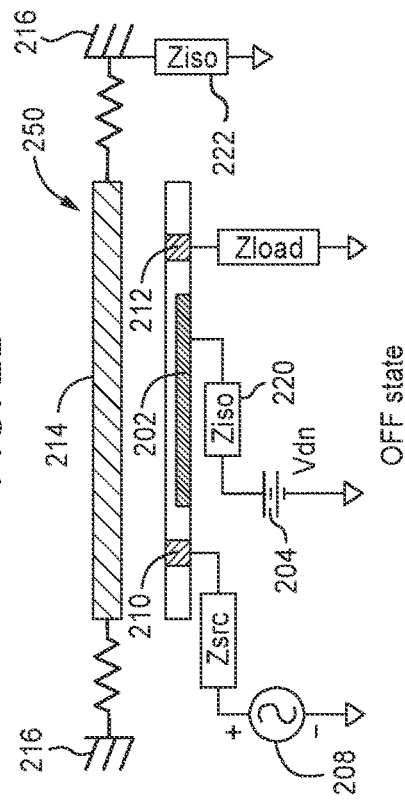

FIGS. 2A-2D illustrate various embodiments of a MEMS relay switch 200 having both "down" and "up" electrostatic actuation capabilities, according to embodiments disclosed herein. FIG. 2A illustrates the MEMS relay 200 in the "on" state, where a movable beam 214 of the MEMS relay 200 is pulled down towards a first electrode 202, a first RF electrode 210, and a second RF electrode 212. FIG. 2B illustrates the MEMS relay 200 in an "off" state, where the movable beam 214 of the MEMS relay 200 is pulled up towards the pull up electrode 206. The MEMS relay 200 of FIGS. 2A-2B comprises a power source 208 coupled to the first RF electrode 210, a voltage "down" connection (Vdn) 204 coupled to the first electrode 202, and a voltage "up" connection (Vup) 218 coupled to a pull up electrode 206. The beam 214 is mechanically anchored at both ends by flexible anchors 216 (e.g., springs).

The floating beam 214 is movable between a first position (i.e., an "on" state) and a second position (i.e., an "off" state). In the first position, the beam 214 is disposed adjacent to the first electrode 202, the first RF electrode 210, and the second RF electrode 212 and spaced from the pull up electrode 206. In the second position, the beam 214 is disposed adjacent to the pull up electrode 206 and spaced from the first electrode 202, the first RF electrode 210, and the second RF electrode 212.

The MEMS relay 200 of FIGS. 2A-2B comprises a first isolation circuit 220 disposed between the first electrode 202 and the Vdn source 204, a second isolation circuit 222 disposed between the anchor 216 and electrical ground potential, and a third isolation circuit 224 disposed between the pull up electrode 206 and the Vup source 218. Each of the isolation circuits 220, 222, 224 comprises at least one resistor. The isolation circuits 220, 222, 224 isolate the MEMS relay 200 to prevent RF leakage, such as the RF leakage described in FIGS. 1A-1D, by adding electrical impedance at RF leakage points. Additionally, the first and second isolation circuits 220, 224 are utilized to isolate the control voltage sources, such as the Vdn source 204 and the Vup source 218. The load impedance of the MEMS relay 200 is represented by Zload and the source impedance is represented by Zsrc.

Figure 2C:
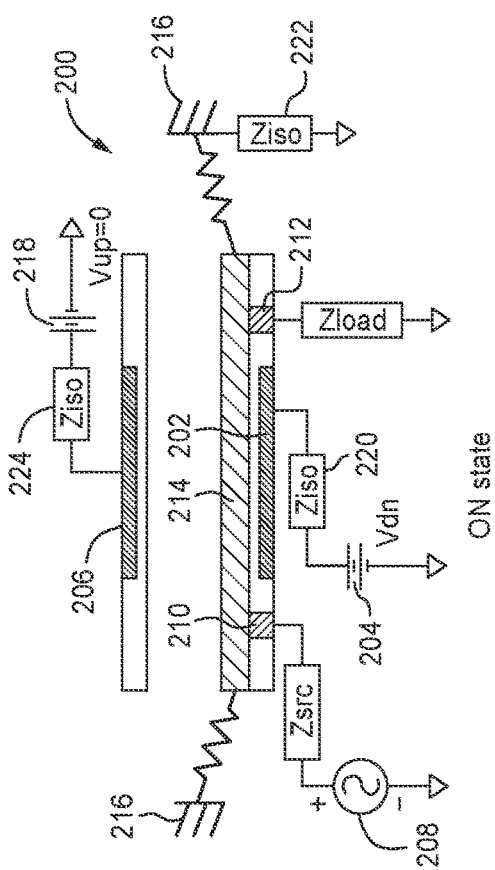
Figure 2D:
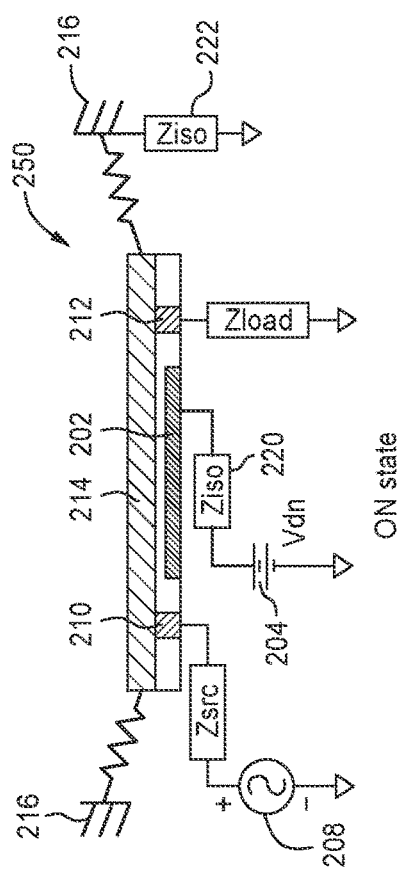

FIGS. 2C-2D illustrates a schematic view of a MEMS relay 250 with a single "down" electrostatic actuation. The MEMS relay 250 is similar to the MEMS relay 200 of FIGS. 2A-2B; however, the pull up electrode 206 and the Vup source 218 portion of FIGS. 2A-2B is removed. In the "on" state shown in FIG. 2C, the beam 214 is in contact with the first and second RF electrodes 210, 212. FIG. 2D illustrates the MEMS relay 250 in an "off" state, where the beam 214 is spaced from the first and second RF electrodes 210, 212. The presence of the first and second isolation circuits 220, 222 in the MEMS relay 250 disposed in the paths to the Vdn source 204 and to ground prevent RF leakage. The load impedance of the MEMS relay 250 is represented by Zload and the source impedance is represented by Zsrc.

In FIGS. 2A-2D, the presence of the isolation circuits provides several benefits. The isolation circuits bias the direct current potential to allow for electrostatic actuation and further provide a path for transient currents during switching. The components of each of the isolation circuits 220, 222, 224 are chosen such that the resistance levels limit RF leakage, while enabling the MEMS relay 200 to function as intended. Exemplary, non-limiting, intended functionalities which need to be maintained include: the speed at which the MEMS moveable beam can switch between an "on" state and an "off" state and vice versa; the capability of the MEMS device as a whole to withstand electro-static discharge events by providing sufficient level of "bleed" current so that the externally applied charge can dissipate without creating damage due to electric field across isolating materials or electric current densities in the conductors; maintain the electric potential at the pull up electrode 206 and first electrode 202 within operating limits during the switching transients. Proper design of the isolation circuits also provides for accurate engineering of actuation waveforms, to be intended as the evolution in time of the electric potentials at the pull up electrode 206 and the first electrode 202. Such waveforms may take into account CMOS outputs, thereby providing acceptable ultimate signal generation needed, with the aim of improved dynamic operation and device reliability.

The isolation circuits further provide a high degree of reliability for the MEMS switch by neutralizing charge that may accumulate during life cycling, while maintaining a zero potential between touching MEMS elements. The isolation circuits provide for leakage paths for electrostatic discharge events to further increase the reliability of the MEMS relay. In addition to the above described advantages, the isolation circuits maintain RF performance (voltage handling, insertion loss, isolation linearity, etc.) while providing proper power handling by uniform RF current distribution.

Although described above as a single relay in FIGS. 2A-2D, other arrangements may be utilized. Multiple relays may be included together into one arrangement. In some non-limiting embodiments, four relays may be provided.

Figure 3:
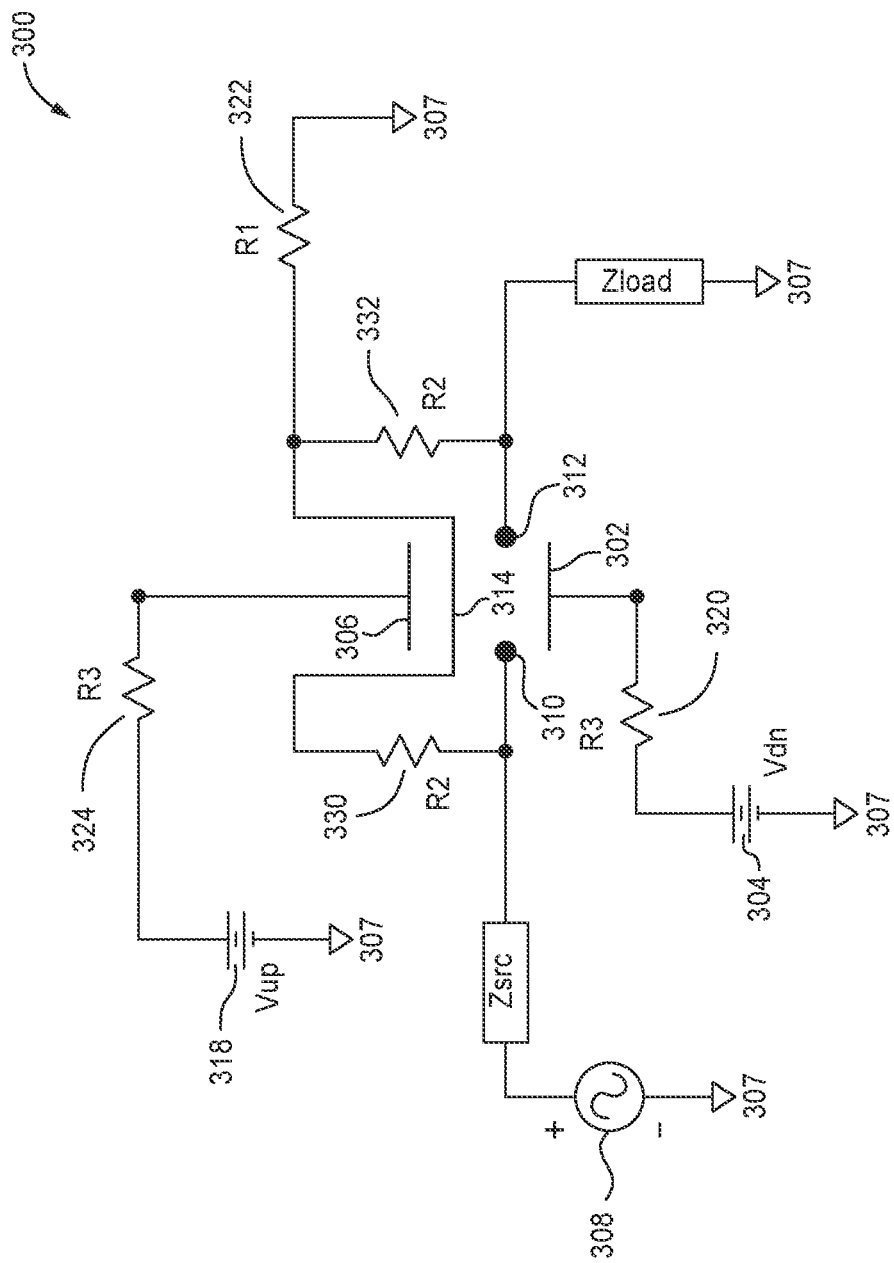
FIG. 3 is a switch connection with a relay as part of a RF isolation resistor network that may be used, for example, in a wireless communication network.

FIG. 3 illustrates an example MEMS relay switch 300 having an RF isolation circuit or network. The isolation circuit may be used in conjunction with the embodiments provided in FIGS. 2A-2D. FIG. 3 has been simplified by removing the mechanical elements and including only the electrical elements. The MEMS relay switch 300 comprises a power source 308. An R1 resistor 322 having a first value is disposed between the beam 314 and DC ground connection 307 to provide a direct current bias of the beam 314 to DC ground 307. The R1 resistor 322 may be utilized as the second isolation circuit 222 of FIGS. 2A-2D. Two R2 resistors 330, 332 having a second value are disposed adjacent to both anchored ends of the beam 314. The first R2 resistor 330 is disposed between the beam 314 and a first RF electrode 310, and the second R2 resistor 332 is disposed between the beam 314 and a second RF electrode 312.

The two R2 resistors 330, 332 are equivalent in value and provide for RF isolation, as well as providing for extra reliability of the MEMS relay 300 by neutralizing electrical change that may accumulate within the relay 300. The two R2 resistors 330, 332 having the second value also provide for a sufficient level of "bleed" current for dissipating externally applied charge due to electrostatic discharge events. Additionally, the two R2 resistors 330, 332 are utilized to avoid the RF-terminals from floating to an uncontrolled direct current potential when left open. The value of the R2 resistors 330, 332 may be chosen according to the circuit upon which the R2 resistors 330, 332 are placed. In one non-limiting embodiment, the value of the R2 resistors 330, 332 may be about 75 kohm to about 1.5 Mohm. A sufficiently elevated resistor level can be chosen to perform RF isolation while still allowing the MEMS relay 300 to operate at the intended frequency.

A first R3 resistor 320 having a third value is disposed between a first electrode 302 (i.e., a pull-down electrode) and the Vdn source 304 such that the Vdn source 304 is isolated to provide proper control of voltage within the MEMS relay 300. A second R3 resistor 324 is disposed between a second electrode 306 (i.e., a pull-up electrode) and the Vup source 318. The two R3 resistors 320, 324 are utilized to isolate the control voltage sources, such as the Vdn source 304 and the Vup source 318. The first and second R3 resistors 320, 324 may be utilized as the first and third isolation circuits 220, 224 of FIGS. 2A-2D, respectively. In one embodiment, the third value of the two R3 resistors 320, 324 is greater than both the first value of the R1 resistor 322 and the second value of the R2 resistors 330, 332. The R1 resistor 322 and the R2 resistors 330, 332 may have about the same value (i.e., the first value may equal the second value).

Figure 4:
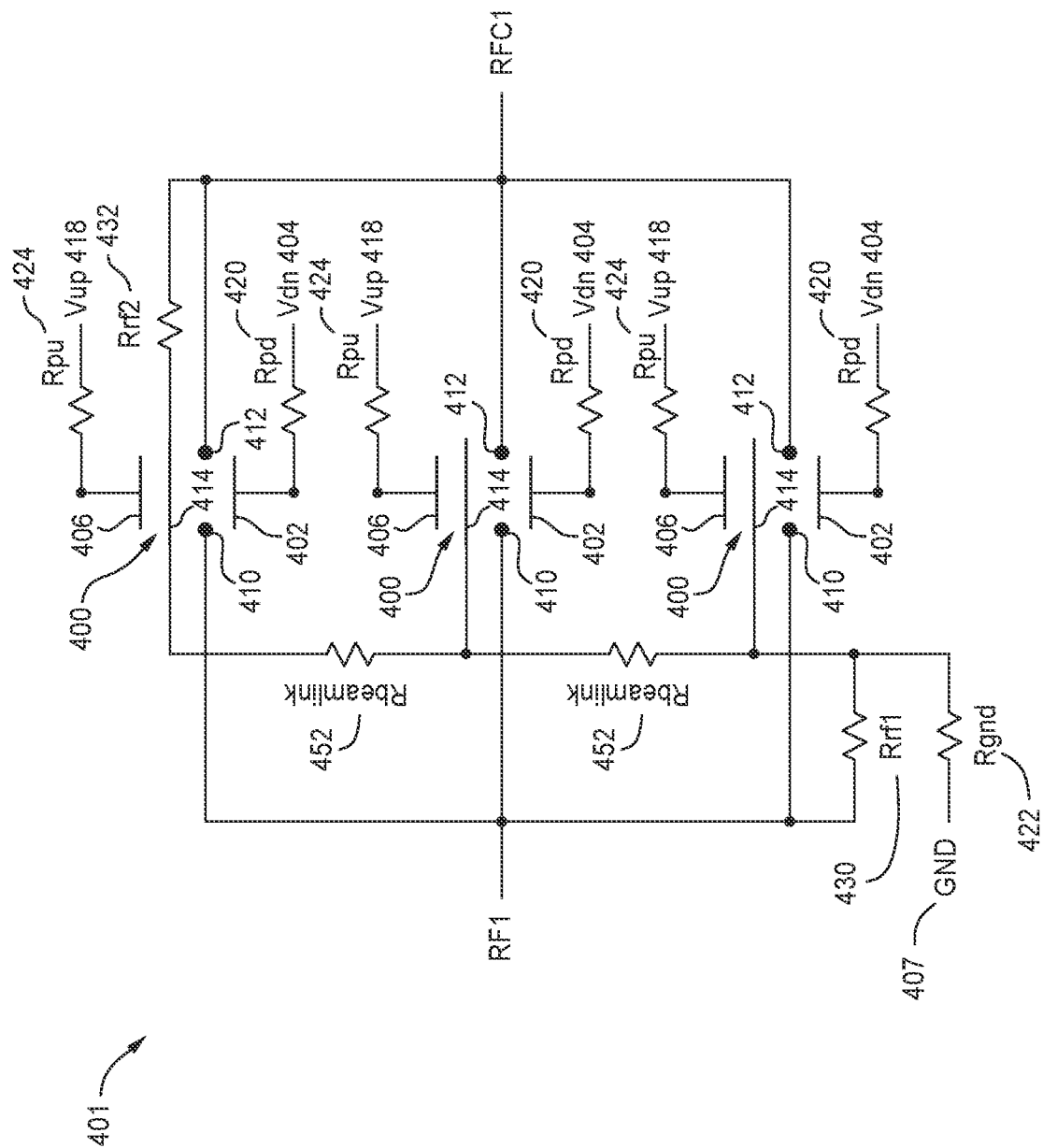
FIG. 4 is an example embodiment of a circuit configuration utilizing three MEMS relay cavities in parallel, according to embodiments disclosed herein.

FIG. 4 illustrates a circuit configuration 401 comprising three different MEMS relay switches 400. Each MEMS relay 400, or electrical arrangement, is disposed in an individual enclosed cavity or cell. The MEMS relays 400 may be used in parallel. Each MEMS relay 400 comprises an Rpu resistor 424 disposed between a first electrode 406 (i.e., a pull-up electrode) and a Vup source 418 (not fully shown), and an Rpd resistor 420 disposed between a Vdn source 404 (not fully shown) and a second electrode 402 (i.e., a pull-down electrode). An Rrf1 resistor 430 is coupled to the MEMS beams 414 and to the first RF terminals 410, and an Rrf2 resistor 432 is coupled to the MEMS beams 414 and to the second RF terminals 412. The Rgnd resistor 422 is coupled to the MEMS beams 414 and to ground 407. An Rbeamlink resistor 452 is disposed between each of the MEMS beams 414 to provide some level of isolation between neighboring cells, which may not occur in a single relay embodiment, such as the MEMS relay 300 described in FIG. 3. The Rpu resistors 424, Rpd resistors 420, Rrf1 resistor 430, Rgnd resistor 422, and Rrf2 resistor 432 are sized to perform RF isolation while still allowing the MEMS circuit configuration 401 to operate at the intended frequency.

Figure 5:
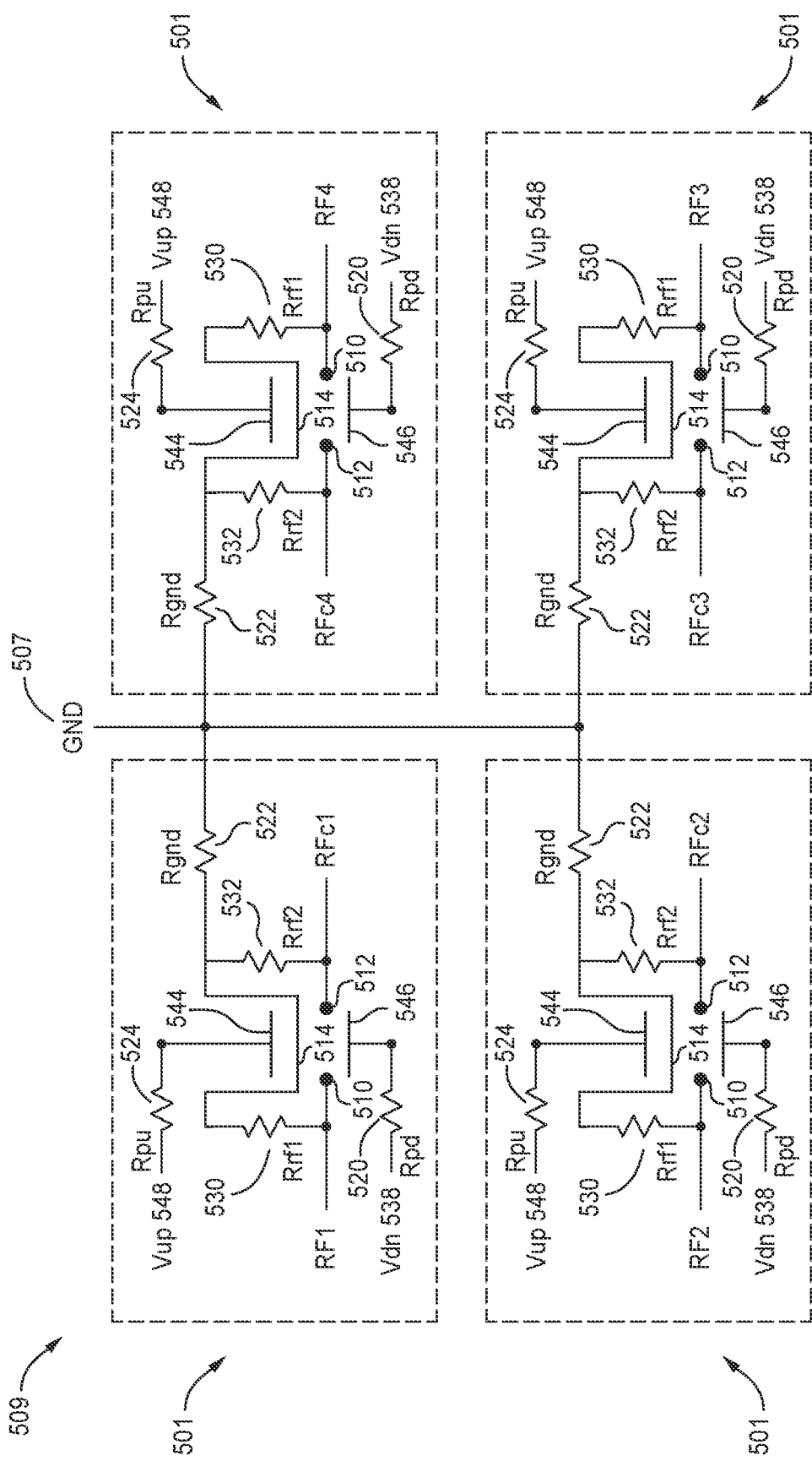
FIG. 5 is an example of a circuit configuration utilizing four MEMS relays, according to embodiments disclosed herein.

FIG. 5 illustrates a circuit configuration 509 comprising four MEMS relay sub-circuit configurations 501. As provided, the embodiment of FIG. 5 provides one additional hierarchical level to the embodiment illustrated in FIG. 4, so that each of the sub-circuit configurations 501 can be described by the circuit configuration 401 in FIG. 4. In this manner, the circuit configuration 509 may be comprised of a plurality of MEMS relays 300 of FIG. 3, where the MEMS relays 300 are coupled together as described in FIG. 4.

Each of the four MEMS sub-circuits 501 is connected to a common ground connection 507 through an Rgnd resistor 522. In one embodiment, the value of the Rgnd 522 of each sub-circuit 501 is about 75 kOhm to about 1.5 MOhm. The Rrf1 resistors 530 are coupled to the MEMS beams 514 and to the first RF terminals 510, and the Rrf2 resistors 532 are coupled to the MEMS beams 514 and to the second RF terminals 512. Each of the Rrf1 and Rrf2 resistors 530, 532 is disposed adjacent to one RF terminals RF1, RFc1, RF2, RFc2, RF3, RFc3, RF4, or RFc4. As in previous embodiments, the Rrf1 and Rrf2 resistors 530, 532 may be equivalent in value and provide for RF isolation as well as providing for extra reliability of each MEMS sub-circuit 501 by neutralizing charge that may accumulate within the MEMS relays. The Rgnd resistors 522 provide a direct current bias of the beams 514 to DC ground 507.

For each of the four MEMS sub-circuits 501, an Rpu network 524 is provided above each beam 514 disposed between a first electrode 544 (i.e., a pull-up electrode) and a Vup source 548 (not fully shown), and an Rpd network 520 is provided below each beam 514 disposed between a Vdn source 538 (not fully shown) and a second electrode 546 (i.e., a pull-down electrode). The resistor networks 524, 520 are connected inside the MEMS sub-circuits 501 the same as in the MEMS relay switches 400 of FIG. 4, and as such, the description of FIG. 4 applies where corresponding elements have been consistently numbered (i.e., Rpu resistor 424 and Rpd resistor 420).

When placed in such an arrangement, each of the RF terminals RF1-RF4 and RFc1-RFc4 are connected, for example, in an embedded wafer level ball grid array. The circuit configuration 509 allows for increased voltage handling and electrostatic discharge events capabilities.

Figure 6:
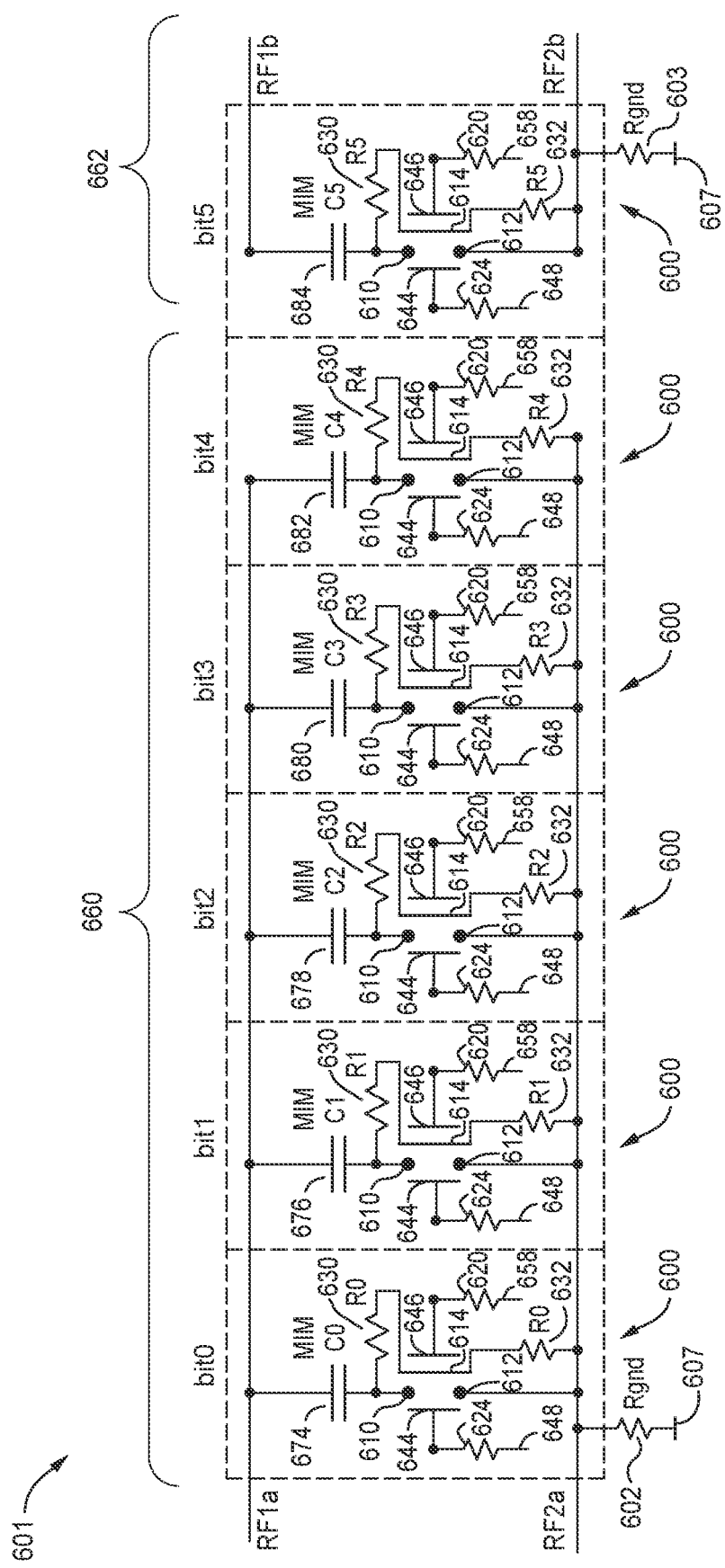
FIG. 6 is a schematic layout of MEMS relays and accompanying capacitors divided in a binary fashion, according to embodiments disclosed herein.

Connections of different MEMS relays, as disclosed above, may be advantageous in digital variable capacitor arrangements. Such applications may be used in wireless technologies, such as cell phones. FIG. 6 illustrates a plurality of MEMS relay switch sub-circuits 600 divided in a binary fashion for controlling different bits of the digital tuner configuration 601. In the illustrated exemplary tuner configuration 601, six different relays 600 are shown, corresponding to a six bit digital control approach; however a greater or lesser number of MEMS relays 600 may be included depending on the number of control bits required in the variable capacitor.

MIM capacitors C0 674, C1 676, C2 678, C3 680, C4 682 are connected between the first RF node 610 of each relay 600 in the first bit group 660 and a first common node RF1a. A MIM capacitor C5 684 is connected between the first RF node 610 of relay 600 in the second bit group 662 and a second common node RF1b.

A first bit group 660 comprises bit0 through bit4, while a second bit group 662 consists of bit5 only, to be considered as the most significant bit (MSB). The second RF nodes 612 of the relays 600 in each bit group 660 and 662 are coupled to the third and fourth common nodes RF2a and RF2b respectively. A first Rgnd resistor 602 of the first bit group 660 is used to couple RF2a to a common ground potential 607. A second Rgnd resistor 603 of the second bit group 662 is used to couple RF2b to a common ground potential 607.

Binary weighting is applied to the size of the MIM capacitors, so that C1=2*C0, C2=2*C1, C3=2*C2, C4=2*C3 and C5=2*C4. This allows for a linear digital to analog conversion transfer function between the 6 bit control and the capacitor value. The six MEMS relay switch sub-circuits 600 included in each bit group can also be binary scaled in terms of number of intrinsic MEMS relays. This would result in bit0 being comprised of N intrinsic MEMS relay switches in parallel, bit1 of 2*N MEMS relays in parallel, bit2 of 4*N MEMS relays, bit3 of 8*N MEMS relays, bit4 of 16*N MEMS relays and bit 5 of 32*N MEMS relays, where N is an integer. This optimum binary scaling approach achieves the best voltage handling characteristic of the digital variable capacitor since RF current will be equally distributed across all of the intrinsic MEMS relays. A partial binary scaling is also possible where space or integration constraints exist, where some of the bits will have the same number of intrinsic MEMS relays while others will have binary scaled ratios to each other. Such a partial binary scaling provides a trade-off between RF voltage handling and MEMS process integration uniformity.

In the digital variable tuner configuration 601, each of the bit groups 660, 662 may share switches and resistors to obtain the best RF performance. Alternatively, each of the switches may be kept independent with a full resistor network to enable the best reliability.

First and second resistor networks 630, 632 (R0, R1, R2, R3, R4, and R5) are illustrated as poly resistors that are utilized in each MEMS relay sub-circuits 600. The first and second resistor networks 630, 632 are utilized to avoid DC floating potentials across the MEMS switch contacts. The first RF poly resistors 630 connect the beams 614 to the first RF nodes 610 in each MEMS relay sub-circuit 600. The second RF poly resistors 632 connect the beams 614 to the second RF nodes 612 in each MEMS relay sub-circuit 600.

Each MEMS relay 600, or electrical arrangement, further comprises a pull up resistor 624 and a pull down or pull in resistor 620. In each MEMS relay 600, the pull up resistors 624 are coupled to a first electrode 644 disposed above each beam 614 and a Vup potential 648, and the pull down resistors 620 are coupled to a second electrode 646 disposed below each beam 614 and a Vdn potential 658.

While one tuner configuration 601 is illustrated in FIG. 6, other configurations are contemplated. For example, each bit group may share one MIM capacitor, or each MEMS relay of each bit group may have an individual MIM capacitor. Furthermore, the RF resistor 632 on the switch-side may be included either per bit or per cell, and the RF resistor 630 on the MIM-side may be included either per bit or per cell.

Figure 7:
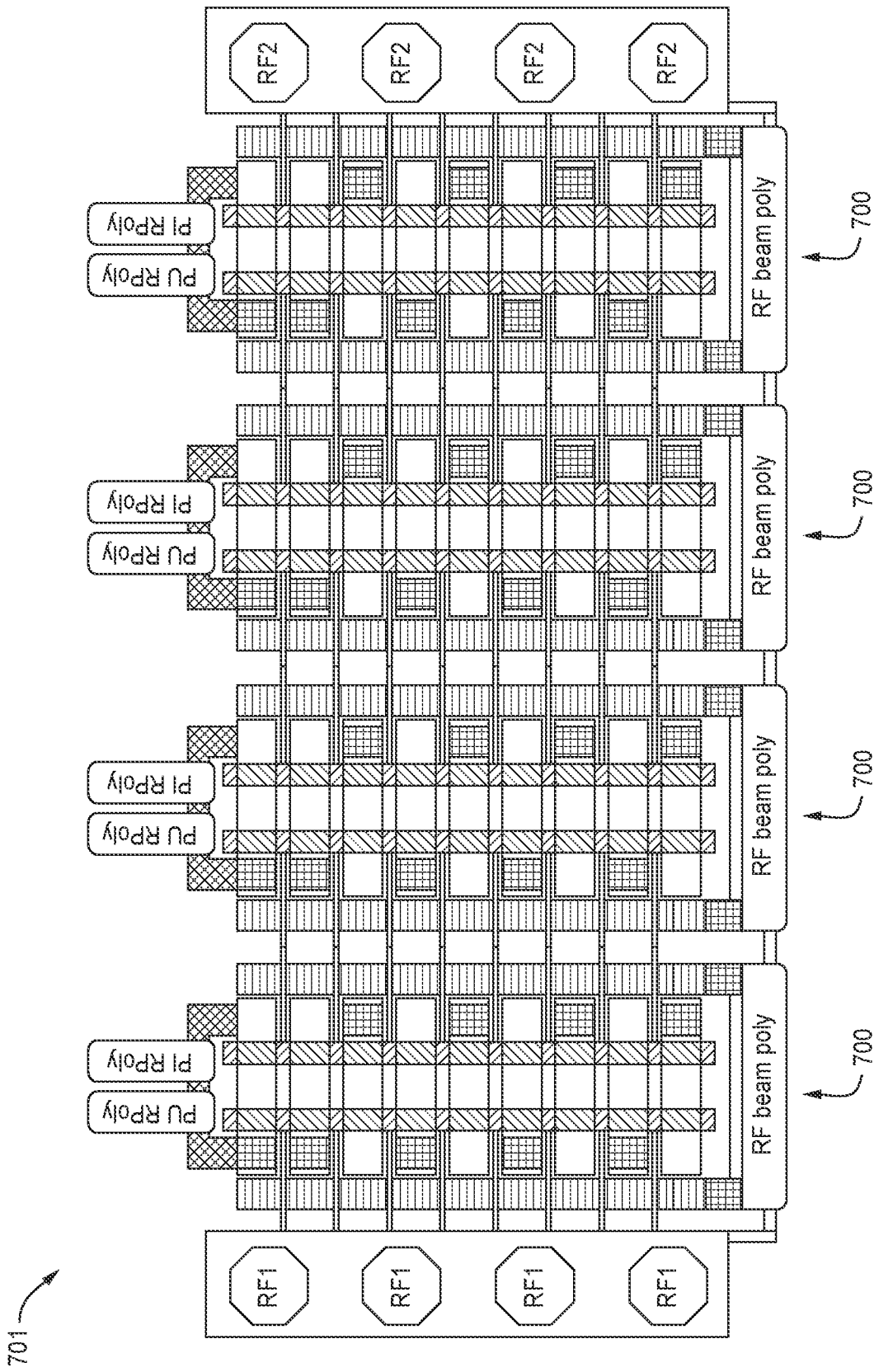
FIG. 7 is a configuration of a switch design with side by side stacked relays for increased voltage handling, according to embodiments disclosed herein.

FIG. 7 illustrates a switch design 701 with side by side stacked relay switches 700 and RF poly arrangements utilized to enable higher voltage between each RF1 and RF2 node. One or more relay switches 700, each comprising a beam, are positioned side by side between the RF1 and RF2 nodes. The beams of each relay switch 700 are connected together through a ladder of an RF beam poly resistor. Such RF beam poly resistors provide RF isolation between two adjacent relay switches 700 while DC biasing all beams to a common ground potential as required for MEMS electrostatic actuation. The relay switches 700 may be configured as provided above in other arrangements, wherein the arrangement may switch from a first position to a second position through a bias voltage. Each of the relay switches 700 may comprise one or more poly resistors. The poly resistors allow each relay switch 700 to be isolated from an RF standpoint while still allowing electrostatic actuation control. While FIG. 7 provides an example implementation, other configurations are possible and as such, the stacking configuration should be considered non-limiting.

Figure 8:
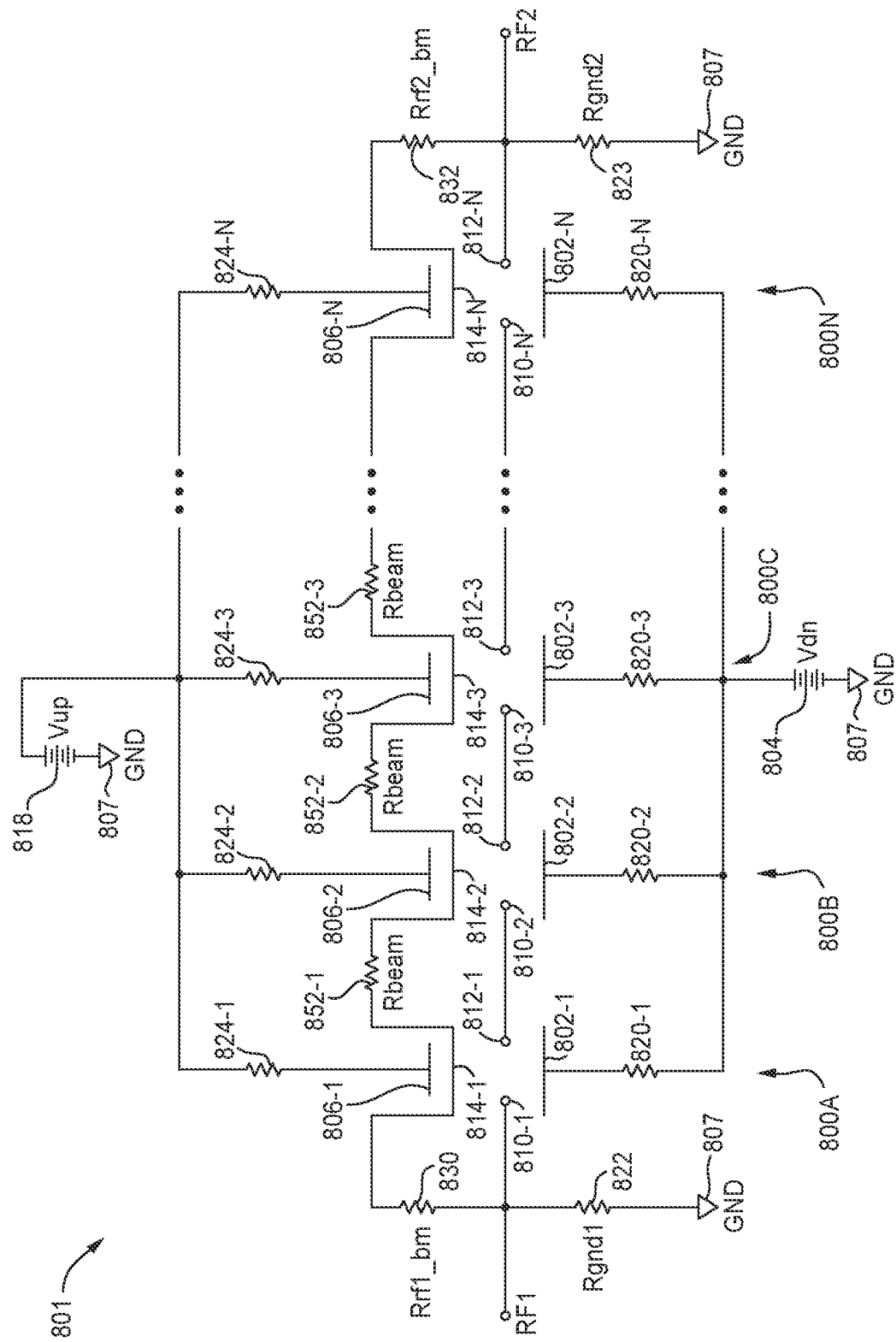
FIG. 8 is a schematic design of side by side stacked cavities for increased voltage handling, according to embodiments disclosed herein.

FIG. 8 provides a schematic of a switch design 801 with side by side stacked MEMS relay switches 800A-800N (collectively referred to as 800). The switch design 801 may comprise any number of stacked relay switches 800. As such, the total number of stacked relay switches 800, or electrical arrangements, is left generic and indicated as "N". The stacked configuration implies that for a given relay switch 800, a first RF electrode 810 is coupled to a second RF electrode 812 of the adjacent relay switch 800. For example, the first RF electrode 810-3 of the third relay switch 800C is coupled to the second RF electrode 812-2 of the second relay switch 800B. The beam 814 of a given relay switch 800 is coupled to both beams 814 of the two adjacent relay switches 800 through an isolator resistor Rbeam 852. For example, the beam 814-2 of the second relay switch 800B is coupled to the beam 814-1 of the first relay switch 800A though the Rbeam resistor 852-1 and to the beam 814-3 of the third relay switch 800C though the Rbeam resistor 852-2.

The first and the last relay switches 800A, 800N provide connection to the RF terminals RF1 and RF2, respectively. The first RF electrode 810-1 of the first relay switch 800A is coupled to RF1, and the second RF electrode 810-N of the last relay switch 800N is coupled to RF2. Isolation resistors are also coupled to both RF terminals RF1 and RF2: the ground biasing resistor Rgnd1 822 coupled between RF1 and common DC ground 807; the ground biasing resistor Rgnd2 823 coupled between RF2 and common DC ground 807; the first beam biasing resistor Rrf1_bm 830 coupled between RF1 and the beam 814-1 of the first relay switch 800A; and the second beam biasing resistor Rrf2_bm 832 coupled between RF2 and the beam 814-N of the last relay switch 800N. The isolation resistors provide DC biasing for the electrostatic actuation of the MEMS relays 800 and further improve reliability by providing a leakage path to any internal or external DC change that could build up during operation of the switch.

Aspects of the disclosure provide circuitry that prevents RF loss in MEMS relay switches and electrical circuits using MEMS relay configurations. Such descriptions above are applicable in typical sizes of approximately 1 to 100 micrometers in size. Such sizes are applicable for MEMS types operations. In embodiments requiring the use of large resistors, such resistors may be conventional based resistors connected to the MEMS configurations. Additionally, in example embodiments requiring the use of capacitors, conventional capacitor units may also be used and connected to the MEMS configurations. As will be understood, for tuning purposes, different types and capacities of capacitors may be used in such arrangements. Moreover, as tuning may be different between such embodiments, configurations may be established wherein blocks of capacitors may be added or subtracted from the MEMS connections, thereby allowing for quick tuning capabilities or alteration of tuning capabilities for the electrical circuits that use such arrangements.

Such configurations thereby minimize the overall cost structure of circuitry that use such features while similarly minimizing RF loss or leakage in MEMS relay switches and electrical circuits using MEMS relay configurations.

The embodiments described provide for direct current biasing for the MEMS relays to enable electrostatic actuation. Such biasing provides a path or paths for transient current to travel during switching. In some embodiments, the paths provide for elimination of such transient currents, thereby increasing the overall reliability of the circuit. If such transient currents were not resolved within the circuit, over time, the currents may damage electrical components, such as relays, causing premature deterioration and failure. As such, the embodiments described increase the reliability and performance of the electrical components.

As will also be understood, some circuitry may require non-steady state generation of electrical energy. Waveforms may be required for various electrical functioning reasons. The aspects of the disclosure do not hamper the generation of these waveforms, and the overall configuration of the RF isolation may be performed such that desired aspects may be enhanced through a co-design process.

Resolution of electrostatic discharge events (ESD) may also be achieved through the embodiments described above. Leakage paths for electrostatic energy are provided, for example to ground, to minimize the resident electrostatic energy.

In the field of telecommunications, the embodiments provided disclose arrangements that minimize insertion loss, or the loss of signal power, resulting from the insertion of the device in a transmission line. The embodiments disclosed further provide for proper voltage handling and isolation, maintaining RF performance for design requirements.

Also in the field of telecommunications, embodiments may be included in digitally tunable arrangements by adding capacitors for linear digital control of capacitance. Capacitors used in such embodiments may be integrated MIM capacitors which may be formed as two parallel layers of capacitor plates and a dielectric material placed between the capacitor plates. In non-limiting embodiments, silicon nitride may be used as the dielectric material.

In the embodiments describing capacitors, digitally tuned capacitors may be used. With the advent of using different frequencies in wireless cellphone technology, use of digitally tuned capacitors may offer greater flexibility to cell phone arrangements that use such technology. In non-limiting embodiments, ranges of tuning range per capacitor may be as low as 0.1 pF to ranges exceeding 3 pF. Such configurations may provide high linearity and quality factor (Q).

In addition to technologies merely using wireless technology, new apparatuses, such as wearable electronics technology, may benefit from such configurations as described. As form factor is extremely important for such devices, having reduced footprint capability provides system architects superior advantages over conventional circuitry apparatus. Thin and useful antennas may be included in such devices with a minimum of cost and footprint space. Additionally, component manufacturers may also have the advantage of pre-designing antenna configurations into components in markets where wireless ranges have not been extended, alleviating the need for a brand new offering once wireless ranges are permitted by local governing bodies.

Those skilled in the art will recognize improvements and modifications to the preferred embodiments of the present disclosure. All such improvements and modifications are considered within the scope of the concepts disclosed herein and the claims that follow.

What is claimed is:

1. An electrical arrangement, comprising:
  a first microelectromechanical relay, the first microelectromechanical relay comprising a beam element configured to switch from a first position adjacent to a first electrode to a second position adjacent a second electrode;
  a first RF electrode and second RF electrode configured to be either electrically isolated or electrically coupled to the beam element in the following manner depending on the beam element position:
    when the beam element is in the first position adjacent to the first electrode, the first and second RF electrodes are coupled to the beam element; and
    when the beam element is in the second position adjacent to the second electrode, the first and second RF electrodes are electrically isolated;
  a first isolation circuit coupled to the first electrode and configured to isolate a lower voltage source from the first electrode; and
  a second isolation circuit coupled to the second electrode and configured to isolate an upper voltage source from the second electrode;
  a third isolation circuit disposed between the beam element and the first RF electrode; and
  a fourth isolation circuit disposed between the beam element and the second RF electrode.

2. The electrical arrangement of claim 1, wherein:
  the first isolation circuit comprises a first bias resistor; and
  the second isolation circuit comprises a second bias resistor.

3. The electrical arrangement of claim 2, further comprising:
  a first ground bias resistor disposed between the beam element and an electrical common ground connection.

4. The electrical arrangement of claim 3, wherein the first ground bias resistor has a lower value than the first bias resistor and the second bias resistor.

5. An electrical arrangement, comprising:
  the electrical arrangement of claim 1 and at least one additional electrical arrangement of claim 2 that together form at least two electrical arrangements, the at least two electrical arrangements electrically coupled in parallel in the following manner:
    at least two first RF electrodes of the at least two electrical arrangements are coupled together; and
    at least two second RF electrodes of the at least two electrical arrangements are coupled together.

6. The electrical arrangement of claim 5, further comprising:
  at least one beam isolation resistor disposed between two beam elements of the at least two electrical arrangements.

7. The electrical arrangement of claim 5, wherein at least one of the at least two beam elements of the at least two electrical arrangements is coupled to an electrical common ground connection through at least one ground bias resistor.

8. The electrical arrangement of claim 5, wherein:
  the first isolation resistor coupled between the at least two first RF electrodes and to one of the at least two beam elements; and
  the second isolation resistor coupled between the at least two second RF electrodes and to one of the at least two beam elements.

9. An electrical arrangement, comprising:
  a first and a second electrical arrangement, each of the first and the second electrical arrangement comprising:
    a first microelectromechanical relay, the first microelectromechanical relay comprising a beam element configured to switch from a first position adjacent to a first electrode to a second position adjacent a second electrode;
    a first RF electrode and second RF electrode configured to be either electrically isolated or electrically coupled to the beam element in the following manner depending on the beam element position:
      when the beam element is in the first position adjacent to the first electrode, the first and second RF electrodes are coupled to the beam element; and
      when the beam element is in the second position adjacent to the second electrode, the first and second RF electrodes are electrically isolated;
    a first isolation circuit coupled to the first electrode and configured to isolate a lower voltage source from the first electrode; and
    a second isolation circuit coupled to the second electrode and configured to isolate an upper voltage source from the second electrode;
  at least two first RF electrodes of the first and second electrical arrangements are coupled together; and
  at least two second RF electrodes of the first and the second electrical arrangements are coupled together
  a first isolation resistor coupled between the at least two first RF electrodes and to one of the at least two beam elements; and
  a second isolation resistor coupled between the at least two second RF electrodes and to one of the at least two beam elements.

10. The electrical arrangement of claim 9, further comprising:
  at least one beam isolation resistor disposed between two beam elements of the at least two electrical arrangements.

11. The electrical arrangement of claim 9, wherein at least one of the at least two beam elements of the at least two electrical arrangements is coupled to an electrical common ground connection through at least one ground bias resistor.

12. The electrical arrangement of claim 9, wherein:
  the first isolation circuit comprises a first bias resistor; and
  the second isolation circuit comprises a second bias resistor.

13. The electrical arrangement of claim 12, further comprising:
a first ground bias resistor disposed between one of the beam elements and an electrical common ground connection.

14. The electrical arrangement of claim 13, wherein the first ground bias resistor has a lower value than the first bias resistor and the second bias resistor.

15. An electrical arrangement, comprising:
a first and a second electrical arrangement, each of the first and the second electrical arrangement comprising:
   a first microelectromechanical relay, the first microelectromechanical relay comprising a beam element configured to switch from a first position adjacent to a first electrode to a second position adjacent a second electrode;
   a first RF electrode and second RF electrode configured to be either electrically isolated or electrically coupled to the beam element in the following manner depending on the beam element position:
      when the beam element is in the first position adjacent to the first electrode, the first and second RF electrodes are coupled to the beam element; and
      when the beam element is in the second position adjacent to the second electrode, the first and second RF electrodes are electrically isolated;
   a first isolation circuit coupled to the first electrode and configured to isolate a lower voltage source from the first electrode; and
   a second isolation circuit coupled to the second electrode and configured to isolate an upper voltage source from the second electrode;
at least two first RF electrodes of the first and second electrical arrangements are coupled together; and
at least two second RF electrodes of the first and the second electrical arrangements are coupled together
a first isolation resistor coupled between the at least two first RF electrodes and to one of the at least two beam elements; and
a second isolation resistor coupled between the at least two second RF electrodes and to one of the at least two beam elements.

16. The electrical arrangement of claim 15, comprising:
at least one of the first RF electrodes coupled to a first electrode of at least one MIM capacitor of a plurality of MIM capacitors;
a second electrode of the each of the MIM capacitors coupled together to form a common first RF electrode; and
a plurality of the second RF electrodes of at least one electrical arrangement coupled together to form a common second RF electrode,
wherein the common second RF electrode is coupled to an electrical common ground node through a common ground resistor.

* * * * *